United States Patent
Hoyack et al.

(10) Patent No.: US 11,901,654 B2
(45) Date of Patent: Feb. 13, 2024

(54) METHOD OF INTERCONNECTING PRINTED CIRCUIT BOARDS

(71) Applicant: Amphenol Corporation, Wallingford, CT (US)

(72) Inventors: Michael A. Hoyack, Sandy Hook, CT (US); Joachim I. Grek, Katrineholm (SE); Owen R. Barthelmes, Putnam Valley, NY (US)

(73) Assignee: AMPHENOL CORPORATION, Wallingford, CT (US)

( * ) Notice: Subject to any disclaimer, the term of this patent is extended or adjusted under 35 U.S.C. 154(b) by 750 days.

(21) Appl. No.: 17/016,651

(22) Filed: Sep. 10, 2020

(65) Prior Publication Data
US 2020/0412034 A1  Dec. 31, 2020

Related U.S. Application Data (62) Division of application No. 15/952,055, filed on Apr. 12, 2018, now Pat. No. 11,056,807.
(Continued)

(51) Int. Cl.
*H01R 12/52* (2011.01)
*H05K 3/36* (2006.01)
(Continued)

(52) U.S. Cl.
CPC .......... *H01R 12/523* (2013.01); *H01R 12/58* (2013.01); *H01R 12/7082* (2013.01);
(Continued)

(58) Field of Classification Search
CPC ...... H01R 12/91; H01R 12/73; H01R 12/523; H01R 12/585; H01R 12/58; H01R 43/205;
(Continued)

(56) References Cited

U.S. PATENT DOCUMENTS 4,514,784 A   4/1985  Williams
5,137,462 A   8/1992  Casey
(Continued)

FOREIGN PATENT DOCUMENTS

CN   101488611 A   7/2009
CN   102544794 A   7/2012
(Continued)

*Primary Examiner* — Thiem D Phan
(74) *Attorney, Agent, or Firm* — CANTOR COLBURN LLP (57) ABSTRACT

A method of interconnecting first and second printed circuit boards using a float connector with a contact assembly that includes installing a first guide member onto the first printed circuit board with the float connector in an open non-compressed position, after installing the first guide member onto the first printed circuit board, installing a second guide member onto the second printed circuit board with the float connector in the open non-compressed position, and compressing the first and second printed circuit boards toward one another to move the float connector from the open non-compressed position to a compressed position until contact ends of the contact assembly of the float connector are exposed outside of the first and second guide members, respectively, thereby electrically connecting the contact ends to the first and second printed circuit boards, respectively, for electrical connection between the first and second printed circuit boards through the float connector.

14 Claims, 8 Drawing Sheets

Related U.S. Application Data (60) Provisional application No. 62/485,628, filed on Apr. 14, 2017.

(51) Int. Cl.
| | | |
|---|---|---|
| *H01R 43/20* | (2006.01) | |
| *H01R 12/58* | (2011.01) | |
| *H05K 1/14* | (2006.01) | |
| *H01R 12/73* | (2011.01) | |
| *H01R 13/453* | (2006.01) | |
| *H01R 12/70* | (2011.01) | |
| *H01R 12/91* | (2011.01) | |
| *H05K 1/02* | (2006.01) | |
| *H05K 3/30* | (2006.01) | |

(52) U.S. Cl.
CPC ............ *H01R 12/73* (2013.01); *H01R 12/91* (2013.01); *H01R 13/4538* (2013.01); *H01R 43/205* (2013.01); *H05K 1/144* (2013.01); *H05K 3/368* (2013.01); *H01R 12/585* (2013.01); *H01R 12/7052* (2013.01); *H05K 1/0243* (2013.01); *H05K 3/308* (2013.01); *H05K 2201/1059* (2013.01); *H05K 2201/10189* (2013.01); *H05K 2203/167* (2013.01); *Y10T 29/4913* (2015.01)

(58) Field of Classification Search
CPC .. H01R 12/714; H01R 13/2421; H05K 1/144; H05K 2201/1059; H05K 3/368; Y10T 29/4913
USPC .................. 29/832, 825, 829, 830, 837, 846
See application file for complete search history.

(56) References Cited

U.S. PATENT DOCUMENTS

| | | |
|---|---|---|
| 6,497,579 B1 | 12/2002 | Garbini |
| 6,695,622 B2 | 2/2004 | Korsunsky |
| 6,749,441 B1 | 6/2004 | Ma |
| 6,773,285 B2 | 8/2004 | Bernat |
| 7,108,567 B1 | 9/2006 | Korsunsky et al. |
| 7,740,488 B2 | 6/2010 | Taylor |
| 8,360,789 B2 | 1/2013 | Yin et al. |
| 8,485,831 B2 | 7/2013 | Cipolla |
| 8,597,050 B2 | 12/2013 | Flaherty |
| 8,721,350 B2 | 5/2014 | Liu |
| 8,734,167 B2 | 5/2014 | Aimoto |
| 8,979,562 B2 | 3/2015 | Crighton |
| 9,039,433 B2* | 5/2015 | Barthelmes .......... H01R 24/542 439/248 |
| 9,484,688 B2 | 11/2016 | Hugel |
| 9,502,836 B2 | 11/2016 | Hashiguchi |
| 10,044,120 B2 | 8/2018 | Wang |
| 2002/0061670 A1* | 5/2002 | Havener ................ H01R 24/50 439/246 |
| 2009/0186495 A1 | 7/2009 | Taylor |
| 2014/0087592 A1 | 3/2014 | Endo et al. |
| 2016/0064839 A1 | 3/2016 | Goodman |
| 2016/0164202 A1 | 6/2016 | Endo et al. |
| 2018/0151967 A1 | 5/2018 | Chen et al. |

FOREIGN PATENT DOCUMENTS

| | | |
|---|---|---|
| CN | 102868056 A | 1/2013 |
| CN | 103503244 A | 1/2014 |
| CN | 105680201 A | 6/2016 |
| EP | 2 445 060 A1 | 4/2012 |
| JP | 2010212138 A | 9/2010 |
| TW | 570358 U | 1/2004 |
| TW | M539713 U | 4/2017 |
| WO | WO 2017/019763 A1 | 2/2017 |

\* cited by examiner

METHOD OF INTERCONNECTING PRINTED CIRCUIT BOARDS

RELATED APPLICATIONS

The present application is a divisional of U.S. application Ser. No. 15/952,055, filed Apr. 12, 2018, which claims priority to U.S. provisional application No. 62/485,628, filed Apr. 14, 2017, the entire disclosures of which are incorporated herein by reference. This application may also be related to commonly owned U.S. application Ser. No. 15/951,059 (now U.S. Pat. No. 10,505,303) entitled Float Connector For Interconnecting Printed Circuit Boards, filed Apr. 11, 2018, the entire disclosure of which is also incorporated herein by reference.

BACKGROUND

The present disclosure generally relates to connectors for interconnecting two printed circuit boards. Most board-to-board RF solutions feature a bullet with a signal contact surrounded by a full coaxial ground. For low profile solutions, e.g. below ~8 mm, the conventional full coaxial bullet is limiting for total achievable misalignment between the printed circuit boards (i.e. float). These conventional board-to-board connectors often cannot compensate for any misaligned between the circuit boards.

SUMMARY

The present disclosure may provide a float connector for interconnecting printed circuit boards that comprises a contact assembly including a plurality of contacts and a holder configured to axially support the contacts, each of the plurality of contacts having opposite first and second contact ends for electrically connecting to the printed circuit boards; a first guide member slidably and flexibly coupled to the holder of the contact assembly, the first guide member having a plurality of first openings corresponding to each of the first contact ends, respectively; a second guide member slidably and flexibly coupled to the holder of the contact assembly, the second guide member having a plurality of second openings corresponding to each of the second contact ends, respectively; and a biasing member disposed between the first and second guide members, the biasing member biasing the first and second guide members away from one another to an open position. When the first and second guide members are in the open position, the first and second contact ends are recessed in the first and second guide members, respectively, and not exposed. The first and second guide members are movable from the open position to a compressed position in which the biasing member is compressed to expose the first and contact second ends outside of the openings of the first and second guide members, respectively.

In certain embodiments, each of the first and second guide members is axially moveable with respect to the contact assembly along an axis generally parallel to longitudinal axes of the contacts to compensate for axial misalignment between the first and second printed circuit boards; the holder supports each of the plurality of contacts in a clearance fit inside thereof, thereby allowing each contact to radially tilt with respect to the holder to compensate for radial misalignment between the printed circuit boards; comprising at least one first alignment feature supported by the first guide member and at least one second alignment feature supported by the second guide member, the at least one first and second alignment features being configured to align the first and second contact ends, respectively, with a respective printed circuit board for electrical connection thereto; each of the first and second alignment features is coupled to the biasing member; each of the first and second alignment features is an alignment pin with a printed circuit board engaging end for engaging one of the printed circuit boards and an opposite biasing member engagement end for coupling with the biasing member; and/or the biasing member is a compression spring and opposite ends of the compression spring are coupled to the first and second alignment pins, respectively.

In some embodiments, each printed circuit board engaging end of the first and second alignment pins has an extended length that is longer than the first and second contact ends; the first and second alignment pins extend through the first and second guide members, respectively; the first guide member includes at least one first latching feature and the second guide member includes at least one second latching feature, the at least one first and second latching members being configured to couple to the holder of the contact assembly; the first and second latching features are spring arms and each spring arm engages a detent on outer surface of the holder in a snap engagement; the holder of the contact assembly includes an outer recessed channel for accommodating the biasing member; and/or the holder includes one or more latching features configured to engage corresponding latching features of the first and second guide members, respectively.

In other embodiments, the openings of the first and second guide members each include a lead-end geometry to assist with receipt of the first and second contact ends, respectively; the openings of the first and second guide members, respectively, are disposed in plates of the first and second guide members, respectively; and/or the plurality of contacts includes at least one signal and a plurality of ground contacts.

The present disclosure may also provide a float connector for interconnecting printed circuit boards that comprises a contact assembly including a plurality of contacts and a holder configured to axially support the contacts, each of the plurality of contacts having opposite first and second contact ends for electrically connecting to the printed circuit boards, a first guide member slidably and flexibly coupled to the holder of the contact assembly, the first guide member having a plurality of first openings corresponding to each of the first contact ends, respectively, a second guide member slidably and flexibly coupled to the holder of the contact assembly, the second guide member having a plurality of second openings corresponding to each of the second contact ends, respectively, means for biasing member the first and second guide members away from one another to an open position, means for axial float of the contact assembly between the first and second guide members to compensate for axial misalignment between the first and second printed circuit boards; and means for radial float of the contact assembly between the first and second guide members to compensate for radial misalignment between the first and second printed circuit boards. In one embodiment, the float connector may further comprise means for aligning the first and second contacts ends of the plurality of contacts with one of the printed circuit boards for electrical connection thereto.

The present disclosure may yet further provide a method of interconnecting first and second printed circuit boards, comprising the steps of providing a float connector comprising a contact assembly, first and second guide members slidably and flexibly coupled to the contact assembly, and a biasing member between the first and second guide members that biases the first and second guide members away from one another, thereby defining an open position of the connector in which first and second contact ends of contacts of the contact assembly are recessed in the first and second guide members, respectively; installing the first guide member onto the first printed circuit board with the float connector in the open position by inserting one or more alignment features of the first guide members into corresponding one or more alignment holes in the first printed circuit board; after installing the first guide member onto the first printed circuit board, aligning the second guide member with one or more alignment holes in the second printed circuit board; after the step of aligning the second guide member, installing the second guide member onto the second printed circuit board with the float connector in the open position by inserting one or more alignment features of the second guide members into the corresponding one or more alignment holes in the second printed circuit board; and compressing the first and second printed circuit boards axially toward one another along an axes generally parallel with a longitudinal axis of the contacts and against the bias of the biasing member until the first and second contact ends are exposed outside of the first and second guide members, respectively, and received in corresponding plated holes in the first and second printed circuit boards, respectively, for electrical connection thereto.

Other embodiments of the method may further comprise the steps of axially aligning the first and second printed circuit boards after the step of installing the first guide member onto the first printed circuit board; radially aligning the first and second printed circuit boards after the step of installing the first guide member onto the first printed circuit board; compressing the first and second print circuit boards towards one another until the first and second guide members abut one another; and/or securing the first and second printed circuit boards to one another after the step of compressing the first and second print circuit boards. In one embodiment, the first and second contact ends slide in corresponding openings in the first and second guide members, respectively, when compressing the first and second printed circuit boards.

The present disclosure may also provide a method of interconnecting first and second printed circuit boards using a float connector with a contact assembly that comprises the steps of installing a first guide member onto the first printed circuit board with the float connector in an open non-compressed position, after installing the first guide member onto the first printed circuit board, installing a second guide member onto the second printed circuit board with the float connector in the open non-compressed position, and compressing the first and second printed circuit boards toward one another to move the float connector from the open non-compressed position to a compressed position until contact ends of the contact assembly of the float connector are exposed outside of the first and second guide members, respectively, thereby electrically connecting the contact ends to the first and second printed circuit boards, respectively, for electrical connection between the first and second printed circuit boards through the float connector.

In certain examples, the contact ends exposed outside of the first and second guide members, respectively, engage plated holes in the first and second printed circuit boards, respectively, for electrical connection therebetween; the method further comprises the step of aligning the first guide member with alignment features of the first guide member before installing the first guide member onto the first printed circuit board; the method further comprises the step of aligning the second guide member with alignments features of the second guide member before installing the second guide member onto the second printed circuit board; the alignments features of the first and second printed circuit boards are holes and each of the first and second guide members have alignment pins that insert into the holes when aligning the first and second guide members with the first and second printed circuit boards, respectively; the method further comprises the step of axially aligning the first and second printed circuit boards after the step of installing the first guide member onto the first printed circuit board; and/or the first and second printed circuit boards are compressed axially toward one another; the method further comprises the step of radially aligning the first and second printed circuit boards after the step of installing the first guide member onto the first printed circuit board;

In other examples, the method further comprises the step of compressing the first and second print circuit boards towards one another until the first and second guide members abut or nearly abut one another; the contact ends slide into corresponding openings in the first and second guide members, respectively, when compressing the first and second printed circuit boards; the method further comprises the step of securing the first and second printed circuit boards to one another after the step of compressing the first and second print circuit boards; at least one biasing member is disposed between the first and second guide members such that the step of compressing the first and second printed circuit boards together is against the bias of the biasing member; and/or the biasing member is a compression spring.

The present disclosure may further provide a method of interconnecting first and second printed circuit boards using a float connector that includes a contact assembly, that comprises the steps of installing a first guide member onto the first printed circuit board with the float connector in an open non-compressed position by engaging one or more alignment features of the first guide member with corresponding one or more alignment features in the first printed circuit board; after installing the first guide member onto the first printed circuit board, aligning a second guide member with one or more alignment features in the second printed circuit board; after the step of aligning the second guide member, installing the second guide member onto the second printed circuit board with the float connector in an open non-compressed position by engaging one or more alignment features of the second guide member with the corresponding one or more alignment features in the second printed circuit board; and compressing the first and second printed circuit boards axially toward one another against a biasing member between the first and second guide members to move the float connector from the open non-compressed position to a compressed position until contact ends of the contact assembly of the float connector are exposed outside of the first and second guide members, respectively, thereby electrically connecting the contact ends to the first and second printed circuit boards, respectively, for electrical connection between the first and second printed circuit boards through the float connector.

In some examples, the method further comprises the step of axially aligning the first and second printed circuit boards after the step of installing the first guide member onto the first printed circuit board; the method further comprises the step of radially aligning the first and second printed circuit boards after the step of installing the first guide member onto the first printed circuit board; the method further comprises the step of compressing the first and second print circuit boards towards one another until the first and second guide members abut or nearly abut one another; and/or the contact ends slide in corresponding openings in the first and second guide members, respectively, when compressing the first and second printed circuit boards.

The present disclosure may yet further provide a method of interconnecting first and second printed circuit boards using a float connector that includes first and second guide members and a contact assembly located between the first and second guide members, that comprise the steps of providing a float connector comprising a contact assembly, first and second guide members slidably and flexibly coupled to the contact assembly, and a biasing member between the first and second guide members that biases the first and second guide members away from one another, thereby defining an open position of the connector in which first and second contact ends of contacts of the contact assembly are recessed in the first and second guide members, respectively; installing the first guide member onto the first printed circuit board with the float connector in the open position by inserting one or more alignment pins of the first guide member into corresponding one or more alignment holes in the first printed circuit board; after installing the first guide member onto the first printed circuit board, aligning a second guide member with one or more alignment holes in the second printed circuit board; after the step of aligning the second guide member, installing the second guide member onto the second printed circuit board with the float connector in the open position by inserting one or more alignment pins of the second guide members into the corresponding one or more alignment holes in the second printed circuit board; and compressing the first and second printed circuit boards axially toward one another along an axes generally parallel with a longitudinal axis of contacts of the contact assembly of the float connector and against the bias of the biasing member until contact ends of the contacts are exposed outside of the first and second guide members, respectively, and received in corresponding plated holes in the first and second printed circuit boards, respectively, thereby electrically connecting the contact ends to the first and second printed circuit boards, respectively, for electrical connection between the first and second printed circuit boards through the float connector.

In certain examples, the method further comprises the step of axially aligning the first and second printed circuit boards after the step of installing the first guide member onto the first printed circuit board; and/or further comprises the step of radially aligning the first and second printed circuit boards after the step of installing the first guide member onto the first printed circuit board.

This summary is not intended to identify essential features of the claimed subject matter, nor is it intended for use in determining the scope of the claimed subject matter. It is to be understood that both the foregoing general description and the following detailed description are exemplary and are intended to provide an overview or framework to understand the nature and character of the disclosure.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

The present disclosure relates to a method of interconnecting two printed circuit boards using a connector that is low profile while also providing both axial and radial float between the printed circuit boards to compensate for any misaligned between the circuit boards.

Referring to the figures, the present disclosure relates to a connector 100, such as an RF board-to-board connector, that has both high float capability and a low profile for interconnecting two printed circuit boards 10 and 12. The connector 100 is effective in applications, such as those with small board spacing, e.g. under ~8 mm. The connector 100 of the present disclosure is designed to compensate for both axial and radial misalignment between the circuit boards. The connector 100 of the present disclosure is designed to achieve higher levels of float even in such low profile applications. The connector 100 is also configured to protect it contacts from damage.

Figure 1:
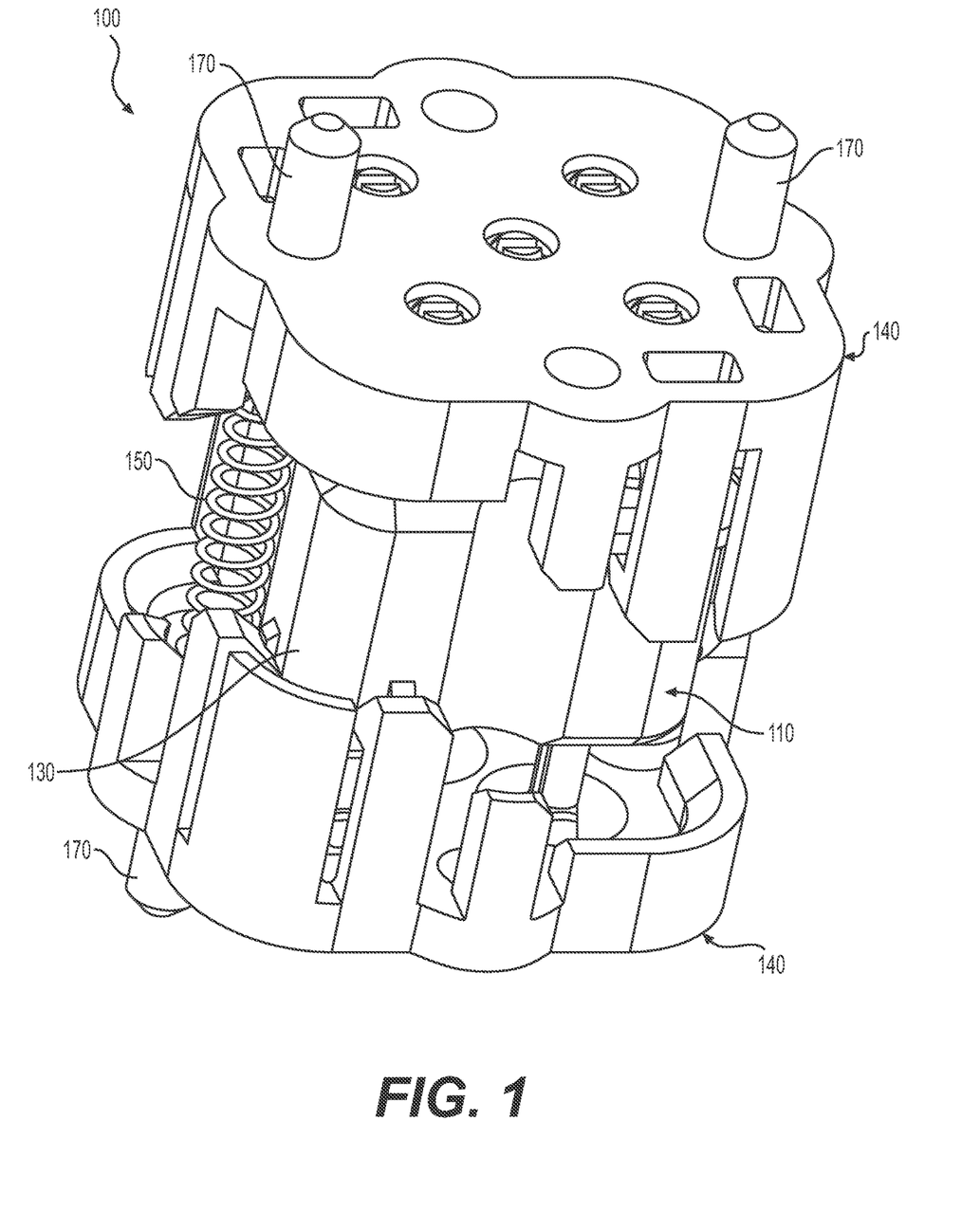
FIG. 1 is a perspective view of a float connector according to an exemplary embodiment of the present disclosure, showing the float connector in an open position.
Figure 2:
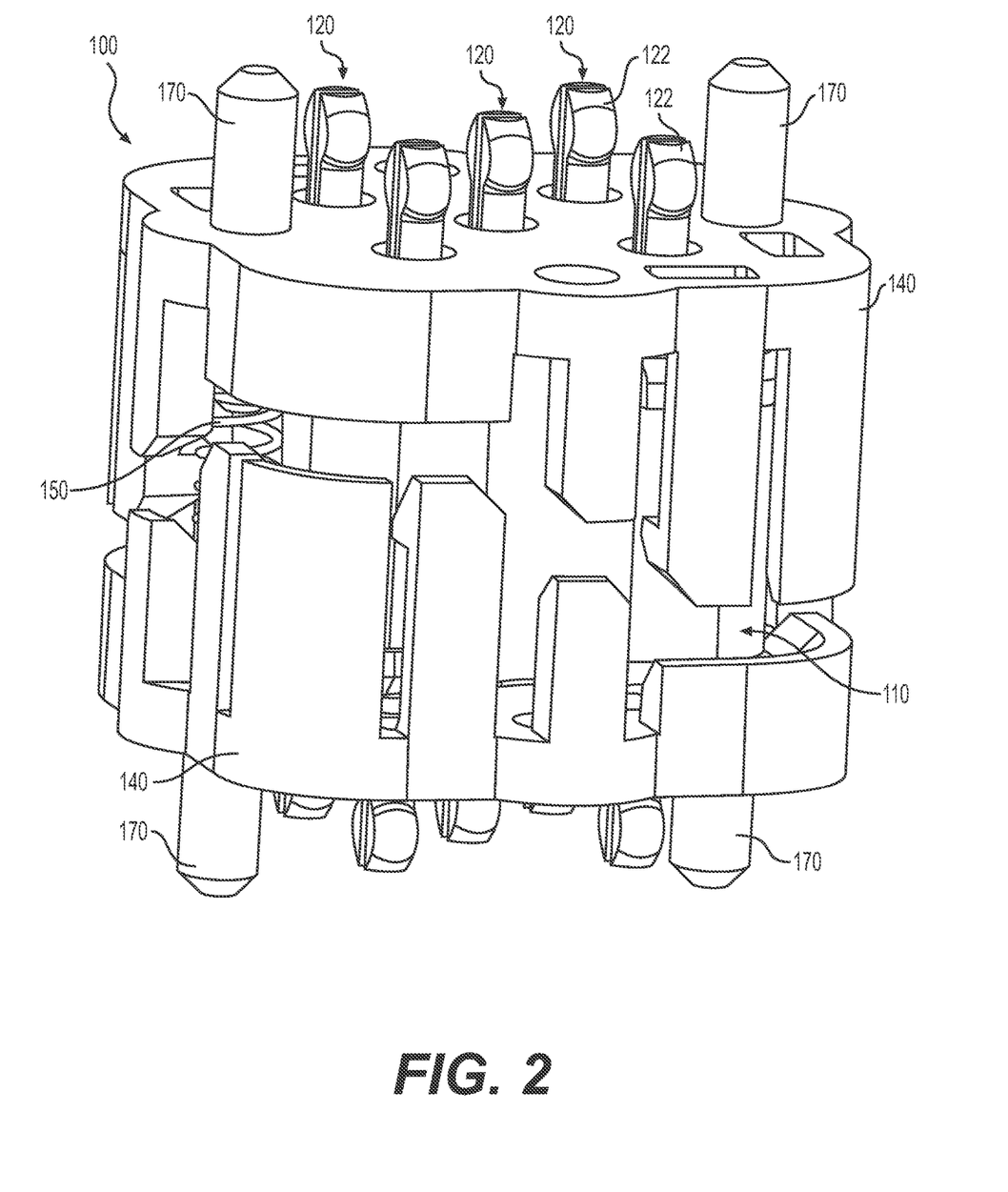
FIG. 2 is a perspective view of the float connector illustrated in FIG. 1, showing the float connector in a compressed position.

Connector 100 according to an exemplary embodiment of the present disclosure generally includes a contact assembly 110 comprising a plurality of contacts 120 supported by a holder 130 in such a manner as to allow radial tilt of the contacts 120, and first and second guide members 140 slidably and flexibly coupled to the contact assembly 110 and configured to be installed on the first and second printed circuit boards 10 and 12, respectively. One ore more biasing members 150, such as a compression spring, may be disposed between the first and second guide members 140 to provide axial float to the connector and to bias the first and second guide members 140 away from one another to an open position of the connector, as seen in FIG. 1.

Figure 3:
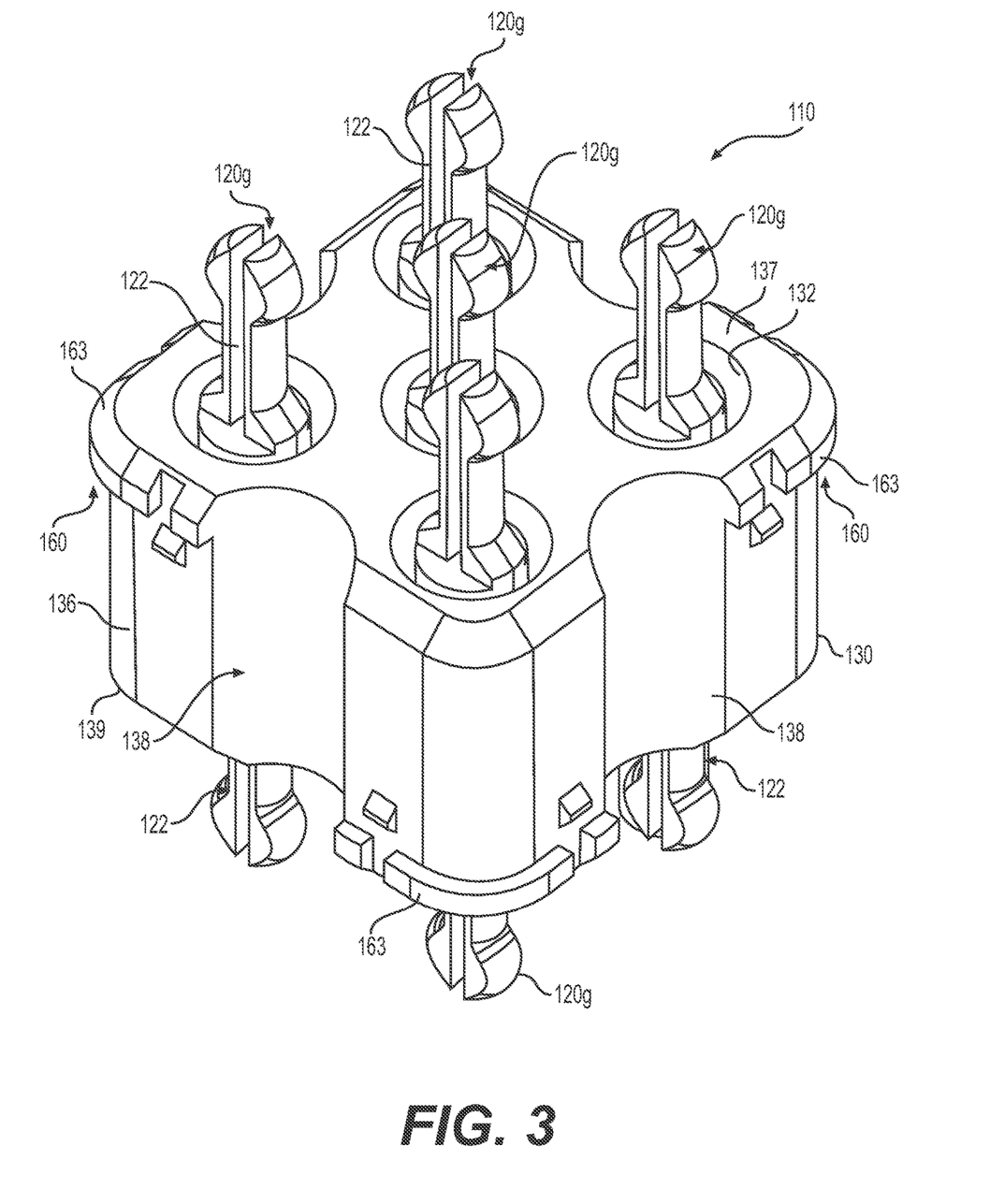
FIG. 3 is a perspective view of a contact assembly of the float connector illustrated in FIG. 1.
Figure 5:
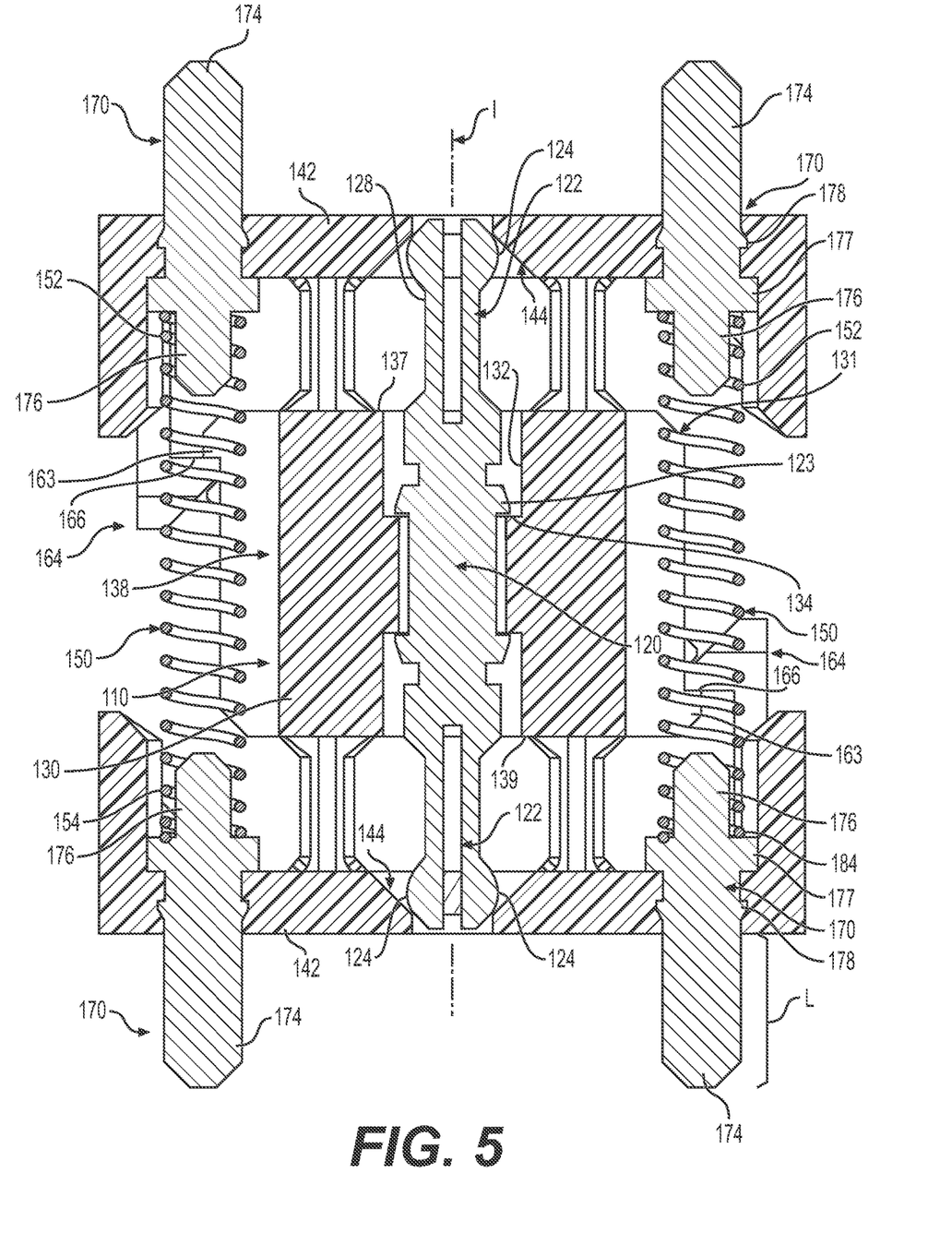
FIG. 5 is a cross-sectional view of the float connector illustrated in FIG. 1.

As seen in FIG. 3, the holder 130 of the contact assembly 110 includes spaced holes or bores 132 that correspond to the position and number of contacts 120. Each hole 132 accepts and holds axially in place an individual contacts 120. The contacts 120 are axially retained in the holder 130 for assembly and handling. Each contact 120 may include an engagement feature, such as one or more outwardly extending ribs 123, that catches on a shoulder 134 inside of the hole 132, as seen in FIG. 5. In one embodiment, the contacts 120 may be arranged in the holes 132 such that a single signal contact 120s is in the center of the holder 130 and the ground contacts 120g are positioned around the signal contact 120s. The holder 130 may be a non-conductive dielectric body 136 with the holes 132 extending through the body 136. Ends 122 of each of the contacts 120 extend outside of the holder body 136 from opposite longitudinal sides thereof. The contacts 120 may be pins, for example, with the ends 122 thereof preferably being slotted and compliant for resiliently engaging the plated holes 14 of the circuit boards 10 and 12. As such, the interconnect provided by connector 100 may be solderless.

The holder body 130 may include outer recessed channels 138 positioned and size to accommodate one of the biasing members 150. One or more latching features 160 (FIG. 3) are provided on the exterior for cooperating with corresponding latching features 162 (FIG. 4) of the guide frames 140. In one embodiment, the latching feature 160 of the holder 130 is a detent or rib 163 extending from the outer perimeter of the holder 130 and the latching feature 162 of the guide frames 140 is a spring arm 164 that includes a catch 166 at is free end for flexibly snapping over the detent 163. The latching features 160 are preferably positioned at opposite ends 137 and 139 of the holder 130 to accommodate both guide members 140.

Figure 4:
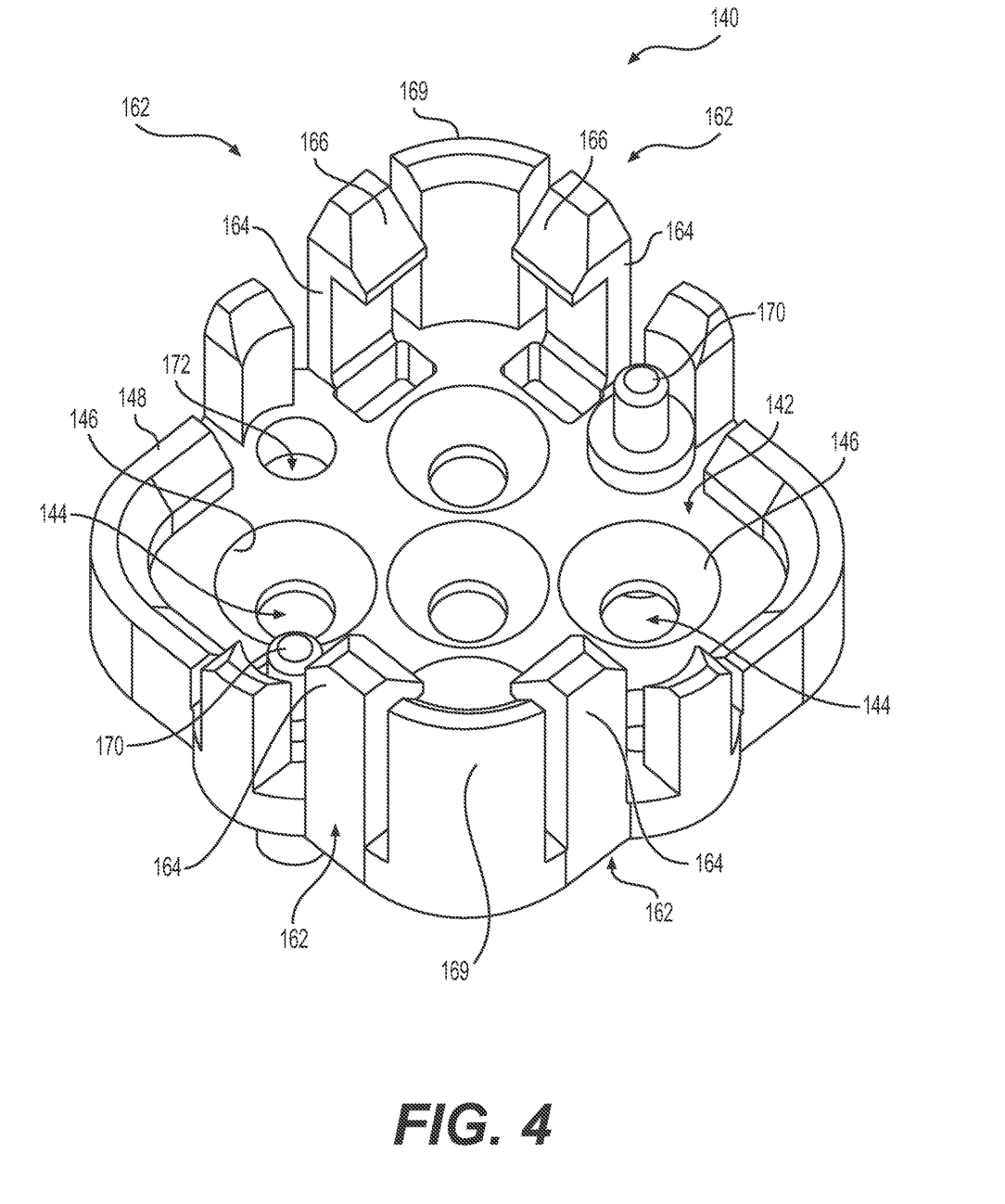
FIG. 4 is a perspective view of a guide member of the float connector illustrated in FIG. 1.

Each guide member 140 may have a base that is a plate 142 with a number of guide features, such as spaced openings 144 corresponding to the number, pattern, or arrangement of the contacts 120 supported in the holder 130. Each opening 144 may be generally funnel shaped to provide lead-in geometry 146 to ease and align insertion of the ends 122 of the contacts 120 when mating the contact assembly 110 the respective boards 10 and 12. The lead-in geometry 146 of the openings 144 guide the ends 122 of the contacts 120 into electrical contact with the printed circuit board, that is when inserted into holes 14 thereof, even if the contacts 120 are out of direct alignment to the holes 14. The latching features 162 may be provided at the perimeter 148 of the plate 142 and positioned to correspond to the latching features 160 of the holder 130. In one embodiment, the latching features 162 are disposed at opposite ends of the plate 142, as seen in FIG. 4. That is, one or more spring arms 164 extend from the perimeter 148 of the plate 142 toward the holder 130 for engagement with respective detents 163. One or more stopping elements 169 may also extend from the perimeter 168 of the plate 142. In one embodiment, each stopping element 169 extends between two spring arms 164 at the opposing ends of the plate 142.

One or more alignment features 170 are preferably incorporated with each guide member 140. The alignment features 170 may be alignment pins, for example, that extend through alignment openings 172 in the plate 142 of the guide members 140. Alternatively, the alignment features 170 may be formed integrally with the plate 142 or formed separately and attached to the plate 142. As best seen in FIG. 5, each alignment pin 170 includes one end 174 that is configured to engage one of the printed circuit boards and an opposite end 176 that is configured to engage the biasing member 150. The end 174 of each alignment pin preferably has an extended length L, that is outside of the guide member 140, which is longer than the contact end 122 of the contacts 120, in order to protect the contact ends 120 when the connector 100 is compressed, as seen in FIG. 6B. The opposite end 176 of each alignment pin may be inserted into one of the opposite ends 152 and 154 of the biasing member 150, as seen in FIG. 5, thereby coupling the alignment pins to the biasing member 150. A shoulder 177 may be provided between the ends 174 and 176 for acting as a stop against the plate 142 of the guide members 140. Each alignment pin 170 may also include an engagement feature, such as an outer rib 178, that is configured to engage the respective alignment opening 172 of the guide member 140.

Each guide members 140 is slidably and flexibly coupled to opposing ends 137 and 139, respectively, of the holder 130 of contact assembly 110, with the biasing members 150 between the guide members 140 and the alignment pins 170 coupled to each guide member and also coupled to the biasing members 150 at their ends 176, as best seen in FIG. 5. The guide members 140 may be slidably and flexibly coupled to the holder ends by snap fitting the spring arms 164 of the guide members 140 onto the detents 163 of the holder 130. The spring arms 164 expand and move over the detents 163 until the catch 166 of each spring arm 164 snaps onto a respective detent 163. A bevel 131 may be provided at each end 137 and 139 of the holder 130 to assist with the expansion of the spring arms 164 when assembling the guide members 140 to the holder 130. This flexible coupling between the guide members 140 and the holder 130 results in a general radial centering of the contact assembly 110. Thus, the contact assembly 110 of the connector may be self-centering which assists with proper alignment when mating the connector with the circuit boards 10 and 12. The flexible nature of the spring arms 164 also allows the contacts 120 to tilt within the holder 130 when there is shifting or radial misalignment of the circuit boards 10 and 12 with respect to one another.

The biasing members 150 bias the guide members 140 away from one another to define the open position of the connector 100, as seen in FIG. 5. The latching of the spring arms 164 of the guide members 140 onto to the detents 163 of the holder acts to limit the expansion of the guide members 140 to this open position of the connector. In the open position, the contact ends 122 are recessed in the plates 142 of the guide members 140 to protect the same, such as during shipping and handling. When the connector 100 is compressed, the spring arms 164 are configured to slide along the sides of the housing 130, as seen in FIGS. 6E and 6F, and the contact ends 122 are exposed outside of the guide members 140 for electrical connection to the circuit boards.

The biasing members 150, which bias against compression of the connector 100, allows the contact assembly 110 and its contacts 120 to move axially for insertion into plated holes 14 (FIG. 6A) in the printed circuit boards 10 and 12. That is, the contact assembly 110 may move along an axis generally parallel to the longitudinal axes 1 of the contacts 120. This movement provides axial float to the connector 100 which compensates for axial misalignment between printed circuit boards 10 and 12. In addition, the contacts 120 preferably have a clearance fit within the holes 132 of the holder 130, as seen in FIG. 5. This allows the individual contacts 120 to tilt with respect to the holes 132 to provide radial float and compensate for radial misalignment between the printed circuit boards 10 and 12. In one embodiment, the contact ends 122 may have one or more generally rounded contact points 124 and a smaller diameter portion 128 to facilitate the free tilting of the contacts 120 without binding when in respective holes 14.

Figure 6A:
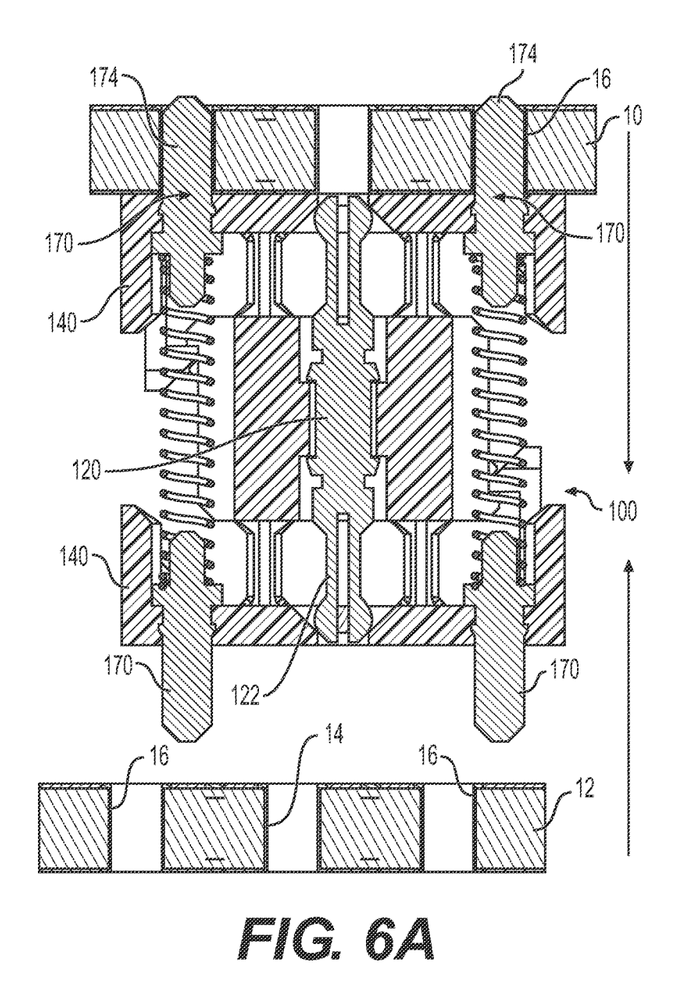
FIGS. 6A-6F illustrate the steps of a method of interconnecting printed circuit boards using the float connector illustrated in FIG. 1.
Figure 6B:
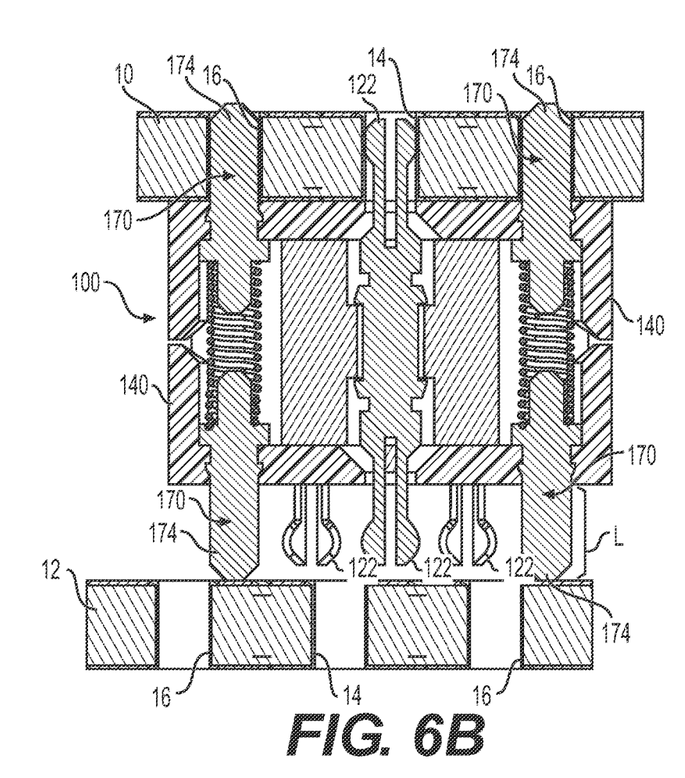
Figure 6C:
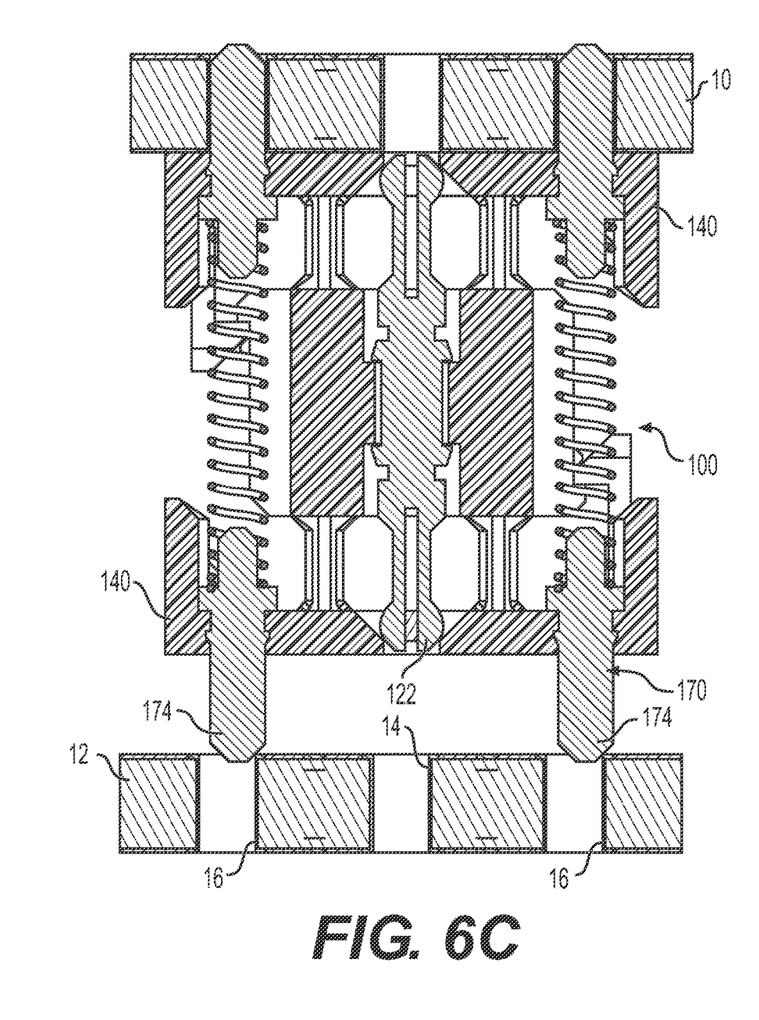
Figure 6D:
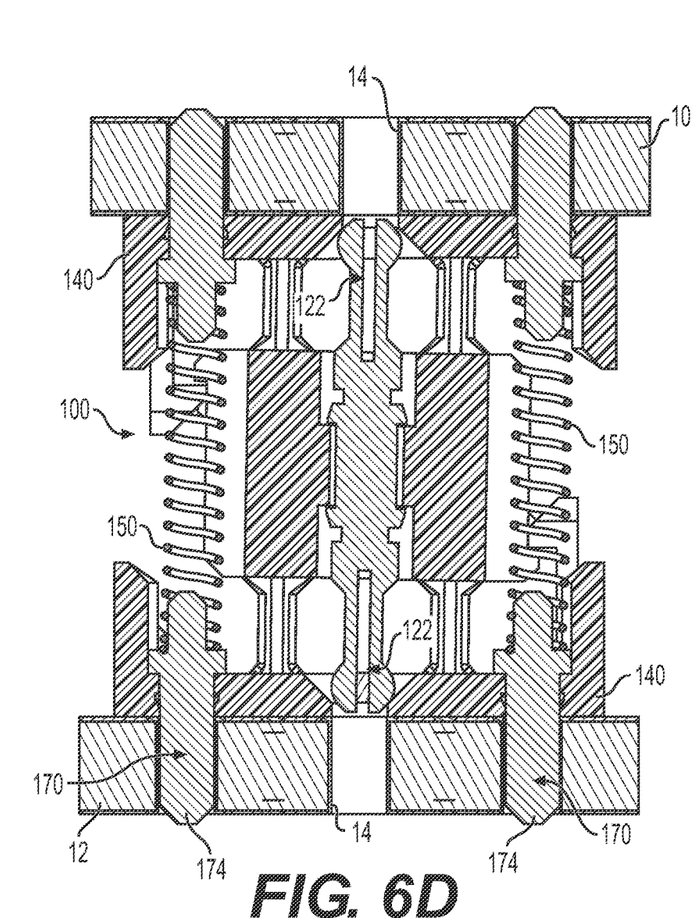
Figure 6E:
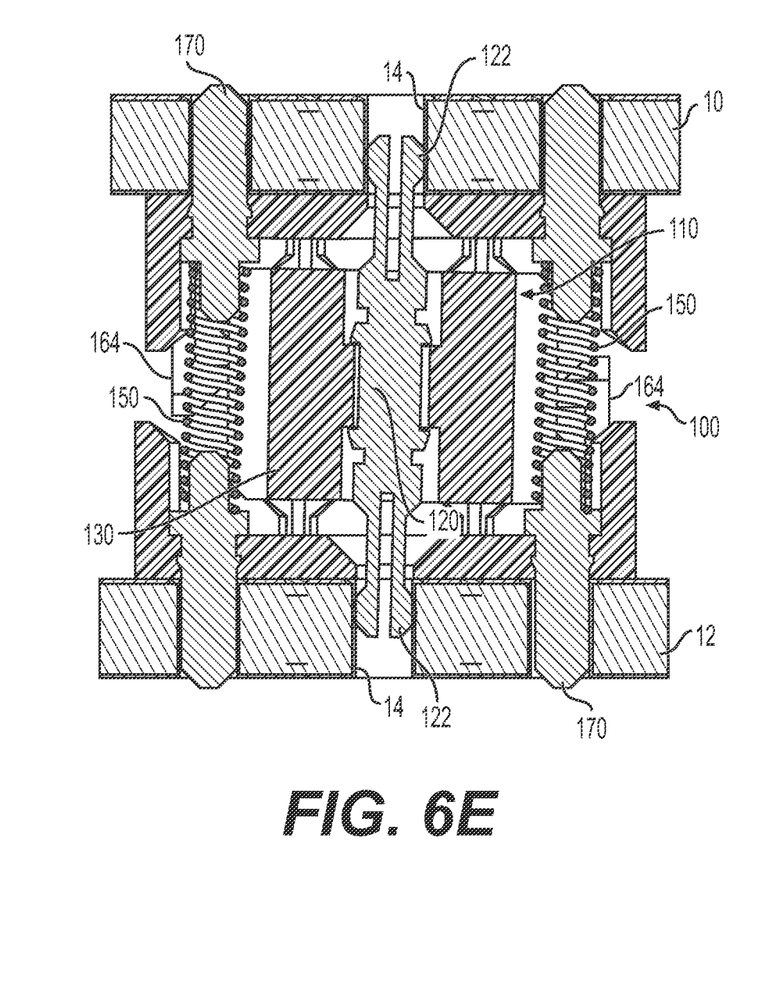
Figure 6F:
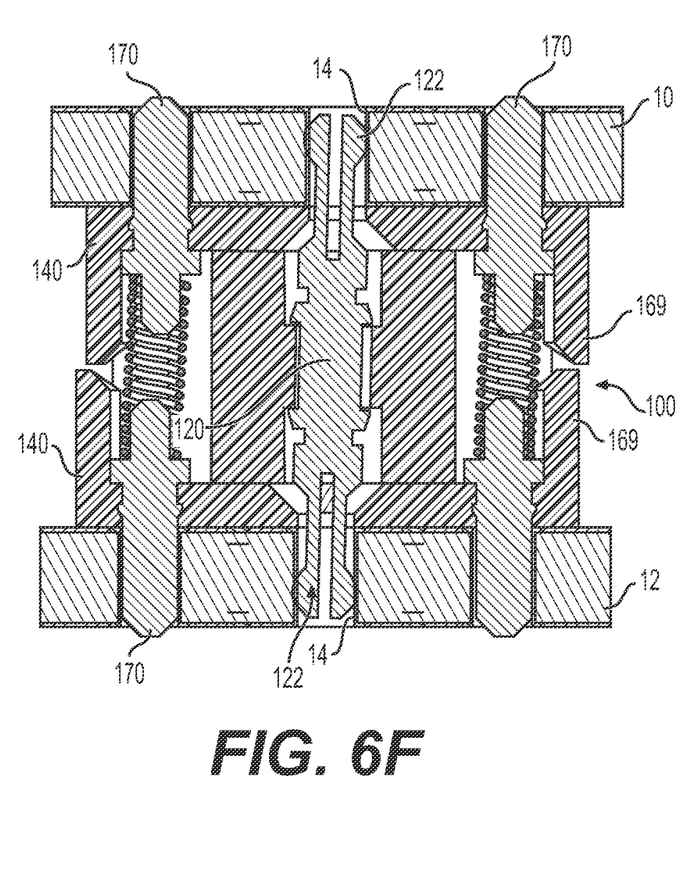

FIGS. 6A-6F illustrate of method of interconnecting printed circuit boards in accordance with an exemplary embodiment of the present disclosure. The connector 100 itself may assembled prior to installing the connector 100 on the circuit boards. One of the guide members 140 is then installed onto the first printed circuit board 10 with the connector 100 in the open position, as seen in FIG. 6A, by inserting the ends 174 of the alignment pins 170 of the first guide member 140 into corresponding alignment holes 16 in the first circuit board 10. The alignment pins 170 may be soldered to the first circuit board 10 in its alignment holes 16. Next, the second guide member 140 should be aligned with the second printed circuit board 12 in order to install the second guide member 140 onto the board 12. The connector 100 is designed such that when aligning the second guide member 140 with the corresponding alignment holes 16 of the second circuit board 12, the contact ends 122 are protected, as seen in FIG. 6B. That is, if the second guide member 140 is not properly aligned with the second circuit board 12, then the ends 174 of the alignment pins 170 associated with the second guide member 140 will abut the surface of the circuit board 12. Due to the extended length L of each alignment pin 170, the contact ends 122 are still protected even if the connector 100 is compressed.

Once the second guide member is properly aligned with the second circuit board 12, as seen in FIG. 6C, the second guide member may be installed onto the second printed circuit board 12 by inserting the ends 174 of the alignment pins 170 of the second guide member into the corresponding alignment holes 16 in the second board 12, as seen in FIG. 6D. The connector 100 remains in its open position with the contact ends 122 recessed. The alignment pins 170 may be soldered to the alignment holes 16 of the board 12.

Next, the connector 100 may be compressed in order to expose the contacts ends 122 for electrical connection with a respective printed circuit board 10 and 12. As seen in FIG. 6E, the connector 100 may be compressed by compressing the first and second printed circuit boards 10 and 12 axially toward one another to move the guide members 140 toward one another. That is the boards 10 and 12 are compressed along an axes generally parallel with the longitudinal axes of the contacts 120 and against the bias of the biasing members 150 until the contact ends 122 are exposed outside of the first and second guide members 140, respectively, and slide axially into corresponding plated holes 14 in the first and second printed circuit boards 10 and 12, respectively, for electrical connection thereto. As the connector 100 is being compressed, the spring arms 164 of each guide member 140 slides along the sides of the holder 130 of the contact assembly 110. FIG. 6F shows the connector 100 fully compressed in which the stopping elements 169 of each guide member 140 abut one another. The circuit boards 10 and 12 may then be secured together to complete the interconnect.

While particular embodiments have been chosen to illustrate the disclosure, it will be understood by those skilled in the art that various changes and modifications can be made therein without departing from the scope of the disclosure as defined in the appended claims. For example, the contacts of the above embodiments may be pin or socket. Also, the connector of the present disclosure may have non-traditional geometry comprising a matrix of pin or socket contacts. To achieve proper impedance between the signal and ground, it is preferable that the float connector of the present disclosure have at least one signal and one ground contact. Adding more ground contacts to the above embodiments can improve impedance consistency and shielding to prevent RF from leaking (crosstalk) between closely placed signal lines.

What is claimed is:

1. A method of interconnecting a first printed circuit board and a second printed circuit board comprising the steps of:
providing a float connector comprising a contact assembly having at least one contact, a first guide member and a second guide member slidably and flexibly coupled to the contact assembly, and a biasing member arranged between the first guide member and the second guide member and configured to bias the first and second guide members away from one another, thereby defining an open position of the float connector in which first and second contact ends of the at least one contact of the contact assembly are recessed in the first and second guide members, respectively;
installing the first guide member onto the first printed circuit board with the float connector in the open position by inserting one or more alignment pins of the first guide member into corresponding one or more alignment holes in the first printed circuit board;
after installing the first guide member onto the first printed circuit board, aligning the second guide member with one or more alignment holes in the second printed circuit board;
after the step of aligning the second guide member, installing the second guide member onto the second printed circuit board with the float connector in the open position by inserting one or more alignment pins of the second guide member into the corresponding one or more alignment holes in the second printed circuit board; and
compressing the first and second printed circuit boards axially toward one another along an axis generally parallel with a longitudinal axis of the at least one contact of the contact assembly of the float connector and against the bias of the biasing member until the first and second contact ends of the at least one contact are exposed outside of the first and second guide members, respectively, and received in corresponding plated holes in the first and second printed circuit boards, respectively, thereby electrically connecting the first and second contact ends to the first and second printed circuit boards, respectively, for electrical connection between the first and second printed circuit boards through the float connector.

2. The method of claim 1, further comprising the step of axially aligning the first and second printed circuit boards after the step of installing the first guide member onto the first printed circuit board.

3. The method of claim 1, further comprising the step of radially aligning the first and second printed circuit boards after the step of installing the first guide member onto the first printed circuit board.

4. The method of claim 1, wherein the step of compressing the first and second printed circuit boards towards one another results in the first and second guide members abutting or nearly abutting one another.

5. The method of claim 1, further comprising the step of securing the first and second printed circuit boards to one another after the step of compressing the first and second print circuit boards.

6. The method of claim 1, wherein the biasing member is a compression spring.

7. The method of claim 1, wherein the first guide member and the second guide member are separate from the contact assembly.

8. The method of claim 1, wherein the contact assembly comprises a holder configured to support the at least one contact of the contact assembly.

9. The method of claim 8, wherein each of the first guide member and the second guide member comprise at least one latching feature, the method further comprising, engaging the at least one latching feature of each guide member with a respective detent of the holder.

10. The method of claim 9, wherein each latching feature comprises a spring arm having a catch at a free end of the spring arm, wherein the catches of the latching features engage with the respective detents of the holder.

11. The method of claim 8, wherein the holder comprises an outer recessed channel configured to receive the biasing member.

12. The method of claim 1, wherein the contact ends of the at least one contact of the contact assembly are slotted ends.

13. The method of claim 12, wherein the slotted ends of the at least one contact resiliently engage with the respective plated holes in the first and second printed circuit boards.

14. The method of claim 1, wherein the biasing member is supported between one alignment pin of the first guide member and one alignment pin of the second guide member.

* * * * *